(12) United States Patent
Wei et al.

(10) Patent No.: US 8,795,495 B2
(45) Date of Patent: *Aug. 5, 2014

(54) METHOD FOR MANUFACTURING A ONE-DIMENSIONAL NANO-STRUCTURE-BASED DEVICE

(75) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

(*) Notice: Subject to any disclaimer, the term of this patent is extended or adjusted under 35 U.S.C. 154(b) by 2134 days.

This patent is subject to a terminal disclaimer.

(21) Appl. No.: 11/371,877

(22) Filed: Mar. 8, 2006

(65) Prior Publication Data

US 2010/0104735 A1   Apr. 29, 2010

(30) Foreign Application Priority Data

Mar. 30, 2005 (CN) .......................... 2005 1 0033908

(51) Int. Cl.
*C25D 13/02* (2006.01)

(52) U.S. Cl.
USPC .......................................... 204/474; 204/490

(58) Field of Classification Search
USPC .................................. 204/490, 474
See application file for complete search history.

(56) References Cited

U.S. PATENT DOCUMENTS

| | | | | |
|---|---|---|---|---|
| 4,082,642 | A | * | 4/1978 | Honig ............................ 204/434 |
| 4,225,408 | A | * | 9/1980 | Barlow et al. .................... 438/72 |
| 4,246,086 | A | * | 1/1981 | Hennicke et al. ................ 205/86 |
| 5,479,278 | A | * | 12/1995 | Takeuchi et al. ............... 349/187 |
| 6,346,189 | B1 | | 2/2002 | Dai et al. |
| 6,962,823 | B2 | * | 11/2005 | Empedocles et al. ............. 438/3 |
| 7,082,683 | B2 | * | 8/2006 | Han et al. ......................... 29/874 |
| 2005/0064618 | A1 | | 3/2005 | Brown et al. |
| 2007/0033992 | A1 | | 2/2007 | Han et al. |

FOREIGN PATENT DOCUMENTS

| | | | |
|---|---|---|---|
| CN | 1292354 | * | 4/2001 |
| CN | 1352461 | A | 6/2002 |
| CN | 1091544 | C | 9/2002 |
| CN | 1538485 | A | 10/2004 |

(Continued)

OTHER PUBLICATIONS

Xue Zeng-Quan, Study on carbon nanotube tips for scaning tunneling microscope, Journal of Chinese Electron Microscopy Society, Oct. 31, 2001, 555-560, vol. 20, Chinese.

(Continued)

*Primary Examiner* — Kishor Mayekar
(74) *Attorney, Agent, or Firm* — Novak Druce Connolly Bove + Quigg LLP

(57) ABSTRACT

A method for manufacturing a one-dimensional nano-structure-based device includes the steps of preparing a solution (14) containing one-dimensional nano-structures (18); providing a plurality of electrical conductors (42), each of the electrical conductors having a first tip (421) to be treated; providing a fixing device (44) having a second tip (441); connecting at least one of the one-dimensional nano-structures with one of the electrical conductors; and repeating the connecting step to another one of the first tips to be treated. Therein, the connecting step further includes the steps of, in part: applying at least a drop of the solution to the first and second tips thereby the first and second tips being interconnected by the solution; applying a voltage between the first and second tips thereby at least one one-dimensional nano-structures being interconnected therewith; and separating the second tip from the first tip.

6 Claims, 2 Drawing Sheets

(56) References Cited

FOREIGN PATENT DOCUMENTS

| | | |
|---|---|---|
| CN | 1541183 A | 10/2004 |
| JP | 2003-287488 | 10/2003 |
| JP | 2004-323342 | 11/2004 |
| TW | 583138 | 4/2004 |
| WO | WO 03/060941 A2 | 7/2003 |
| WO | WO 2004/052489 A2 | 6/2004 |

OTHER PUBLICATIONS

Wu-Xue, Probe of the scanning microscope, Modern Physics, Mar. 20, 2000, 32-33, vol. 12(2), Chinese.

* cited by examiner

METHOD FOR MANUFACTURING A ONE-DIMENSIONAL NANO-STRUCTURE-BASED DEVICE

CROSS-REFERENCE TO RELATED APPLICATIONS

This application is related to a copending U.S. patent application Ser. No. 11/371,991 filed on Mar. 8, 2006 entitled "Method For Manufacturing A One-dimensional Nano-Structure-based Device" with the same assignee, and a copending U.S. patent application Ser. No. 11/371,994 filed on Mar. 8, 2006 entitled "Method For Manufacturing A One-dimensional Nano-Structure-based Device" with the same assignee. The disclosures of the above-identified applications are incorporated herein by reference.

BACKGROUND

1. Field of the Invention

The present invention relates to nano-structure-based devices, and particularly to a method for manufacturing a one-dimensional nano-structure-based device.

2. Discussion of the Related Art

In nano technology field, a variety of nano-scale structures (hereinafter called nano-structures), such as carbon nanotubes, silicon nano-threads, and zinc oxide nano-threads, can be artificially synthesized. Nano-structures have been implemented into numerous fields, such as, field effect transistors, sensors, and atomic force microscopes (AFMs).

For example, as regards the AFM, the probe tip of the AFM generally comprises a nano-structure, such as a bundle of carbon nanotubes or a single carbon nanotube. The carbon nanotube/tubes are generally attached to the probe tip by the following methods: (1) drawing a bundle of carbon nanotubes or a single carbon nanotube out from bundles of carbon nanotubes using the probe tip under an optical microscope; (2) disposing the carbon nanotube/tubes onto the probe tip using another AFM; (3) forming the carbon nanotube/tubes as extensions of the probe tip.

However, the above-mentioned methods have common shortcomings, in that they are complicated processes, require a lot of time, and have low production efficiency.

What is needed, therefore is to provide a method for manufacturing a nano-structure-based device that is easy to control, and which is also less time consuming.

SUMMARY

A method for manufacturing an apparatus having one dimensional nano-material provided herein generally includes the steps of preparing a solution containing one-dimensional nano-structures; providing a plurality of electrical conductors, each of the electrical conductors having a first tip to be treated; providing a fixing device having a second tip; connecting at least one of the one-dimensional nano-structures with one of the electrical conductors; and repeating the connecting step to another one of the first tips to be treated. Therein, the connecting step further includes the steps of arranging one of the first tips of the electrical conductors and the second tip of the fixing device to be spaced apart from and opposite to each other; applying at least a drop of the solution to the first and second tips thereby the first and second tips being interconnected by the solution; applying a voltage between the first and second tips thereby at least one one-dimensional nano-structures being interconnected between the first and second tips, and removing the liquid solvent of the solution; and separating the second tip of the fixing device from the first tip of the electrical conductor to form the first tip having the one-dimensional nano-structures connecting therewith.

These and other features, aspects, and advantages of the present one-dimensional nano-structure-based device will become more apparent from the following detailed description and claims, and the accompanying drawings.

BRIEF DESCRIPTION OF THE DRAWINGS

Many aspects of the present method for making the one-dimensional nano-structure-based device can be better understood with reference to the following drawings. The components in the drawings are not necessary to scale, the emphasis instead being placed upon clearly illustrating the principles of the present method. Moreover, in the drawings, like reference numerals designate corresponding parts throughout the several views.

DETAILED DESCRIPTION OF THE PREFERRED EMBODIMENTS

Figure 1:
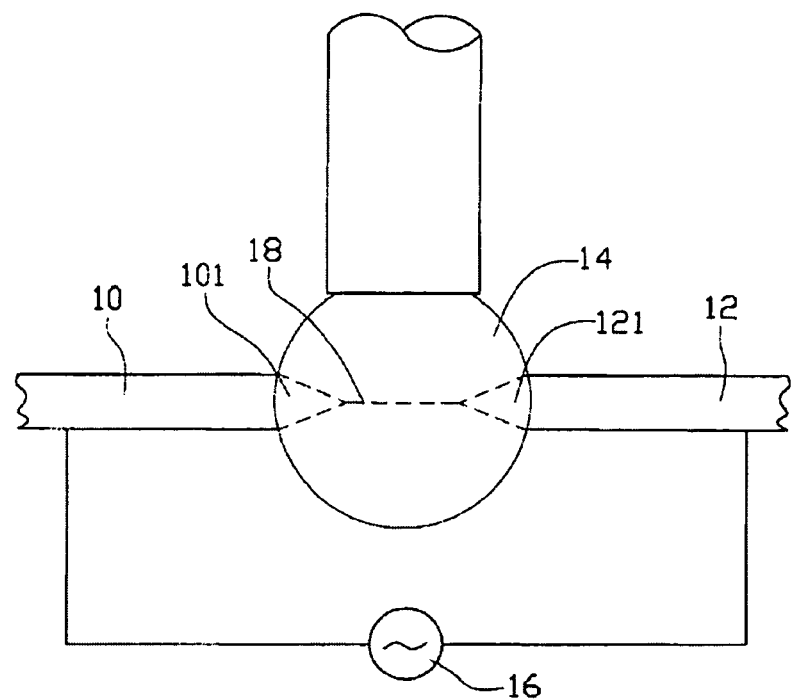
FIG. 1 is a schematic view showing a stage of a method for manufacturing a one-dimensional nano-structure-based device in accordance with one embodiment.

FIG. 1 shows a method for manufacturing a one-dimensional nano-structure-based device in accordance with an exemplary embodiment. Theoretically, the method may be employed to assemble almost all kinds of one-dimensional nano-structures such for example as, nanotubes, nano-rods, or nano-threads, to a semi-finished device. The one-dimensional nano-structures are advantageously electrical conductive material. In order to simplify the description of the present embodiment, the steps of the method will be described below in detail, using carbon nanotube as an example of the those kinds of the one-dimensional nano-structures. In the illustrated embodiment, the method comprises the steps of:

Step (1), preparing a solution 14 containing carbon nanotubes 18 and a liquid solvent;

Step (2), providing a pair of electrical conductors 10, 12, the electrical conductors 10, 12 having respective tips 101, 121; the tips 101, 121 being arranged to be spaced apart from and opposite to each other;

Step (3), applying at least a drop of the solution 14 to the tips 101, 121 of the electrical conductors 10, 12, the tips 101, 121 thereby being interconnected by the solution 14;

Step (4), applying a voltage 16 between the tips 101, 121, at least one carbon nanotube 18 thereby being connected with the tips 101, 121 of the electrical conductors 10, 12, and removing the liquid solvent of the solution 14; and Step (5), applying an external energy to at least one of the conductors and the one-dimensional nano-structure so as to disconnect the conductors from each other thereby obtaining at least one conductor having the tip with the one-dimensional nano-structure connected therewith.

In the illustrated embodiment, the solution 14 contains isopropyl alcohol, and ethyl cellulose. The isopropyl alcohol is used as a main solvent. The ethyl cellulose is used as a stabilizer. The solution 14 is advantageously, but optionally, pretreated using an ultrasonic generator to distribute the carbon nanotubes evenly and uniformly therein before the solution 14 is applied to the tips 101, 121. However, it is to be understood that the solution 14 could be prepared by utilizing other similar suitable solvent and/or stabilizer. Further, otherwise treating steps such as filtrating could be used to obtain the stable uniform solution 14.

It is recognized that the more the concentration of the carbon nanotubes in the solution 14, the more the numbers of the carbon nanotube that may be connected with the tips 101, 121. Thus, the numbers of the carbaon nanotubes that is to be subsequently connected between the tips 101, 121 can be controlled by adjusting the concentration of the carbon nanotubes in the solution. For example, if only one carbon nanotube is desired to connect with the tips 101, 121, the concentration of the carbon nanotubes in the solution should be as low as possible.

In step (2), the electrical conductors 10, 12 is made of a material comprised of tungsten or its alloy. Alternatively, other metals such as gold, molybdenum, platinum, or an alloy thereof could be also utilized instead. The electrical conductors 10, 12 are generally configured to be cylindrical or frustoconical in shape.

The tips 101, 121 are configured to be conical. The tips 101, 121 preferably have a width/diameter in the range from about 10 microns to about 1000 microns. Alternatively, the micro tips 101, 121 could be configured to be frustoconical. If the tips 101, 121 each have flat top surfaces, the micro tips 101, 121 should be arranged with parts of the top surfaces facing each other, for example, edges of the top surfaces facing each other. A distance between the micro tips 101, 121 is generally slightly less than the length of the carbon nanotube 18, this distance is generally below 100 microns. A preferable distance is below 10 microns.

In step (3), at least a drop of the solution 14 is applied between the tips 101, 121 by a syringe 17. The volume of the drop of the solution that is applied to the tips is in the range from about 0.01 to about 0.2 ml. Other suitable apparatus, such as a straw, or a pipet, can also be used instead. It should be noted that the volume of the solution 14 applied to the tips 101, 121 should be sufficient to interconnect the tips 101, 121. Alternatively, the tips 101, 121 could be directly dipped into a container (such as a beaker) having a tiny amount of the solution 14 therein.

In step (4), the voltage 16 is preferably an A.C. (alternating current) voltage 16. The A.C. voltage 16 has a peak value of about 10 volts or less, and has a frequency in the range from about 1000 Hz to about 10 MHz. Generally, the A.C. voltage 16 could be applied for a time period in the range from about several seconds to several tens of seconds, until at least one of the carbon nanotubes 18 is connected with at least one of the tips 101, 121. That is, the method takes relatively little time, and enables a high manufacturing efficiency to be attained.

The present method essentially operates based on the principle of double-directional electrophoresis. Once the A.C. voltage 16 is applied between the electrical conductors. An electrical field is correspondingly established between the tips of the electrical conductors 10, 12. The carbon nanotubes 18 in the solution 14 are then forced to move toward a direction in which electrical field intensity associated therewith increases. Accordingly, the carbon nanotubes 18 are stretched and extend toward the tips 101, 121, at which the electrical field intensity is generally the highest. Eventually, at least one carbon nanotube 18 may be connected with at least one of the tips 101, 121. By the present method, the carbon nanotube 18 can be firmly secured to the tips 101, 121 via Van der Waals attractions therebetween.

Figure 2:
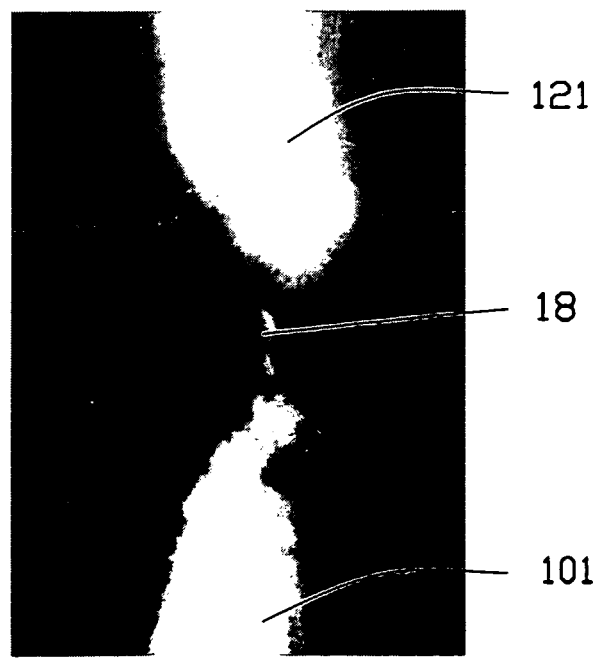
FIG. 2 is an image showing a carbon nanotube interconnected between tips of two electrical conductors, the image being taken using an optical microscopy.

FIG. 2 is an image showing a carbon nanotube 18 interconnected between the tips 101, 121, the image being taken using optical microscopy. Furthermore, the carbon nanotube 18 is stretched to be substantially straight along a longitudinal direction thereof. This is because that the carbon nanotube 18 is polarized by the electrical field, thereby having electrical charges at two ends thereof. During the movement of the carbon nanotube 18 toward the tips 101, 102, the electrical field exerts a force to opposite ends of the carbon nanotube 18. The force stretches the carbon nanotube 18 to be substantially straight.

In step (4), when at least one of the carbon nanotube 18 is connected with the tips 101, 121, the A.C. voltage 16 is switched off, and the liquid solvent of the solution 14 is removed from the tips 101, 121.

In step (5), an exterior energy is applied to the electrical conductors and/or the carbon nanotube 18 connected therebetween so as to obtain at least one tip having the carbon nanotube 18 connected thereon. The exterior energy may be a laser, an electric current, a force or other suitable energy. For instance, a probe having a high temperature could be utilized to burn out the carbon nanotube 18 thereby obtaining at least one tip with a carbon nanotube segment connected thereon. The high temperature is generally higher than a fire point of the carbon nanotube 18. If the carbon nanotube 18 is cut out from its middle part, the tips 101, 121 may each have a part of the carbon nanotube 18 thereon. If the carbon nanotube 18 is cut out from its end near one of the tips 101, 121, only the other of the tips 101, 121 has the carbon nanotube 18 connected thereon. Otherwise, when a plurality of the carbon nanotubes 18 interconnect with the tips 101, 121, it is possible that each of the tips 101, 121 has at least one of the carbon nanotubes 18 thereon.

Figure 3:
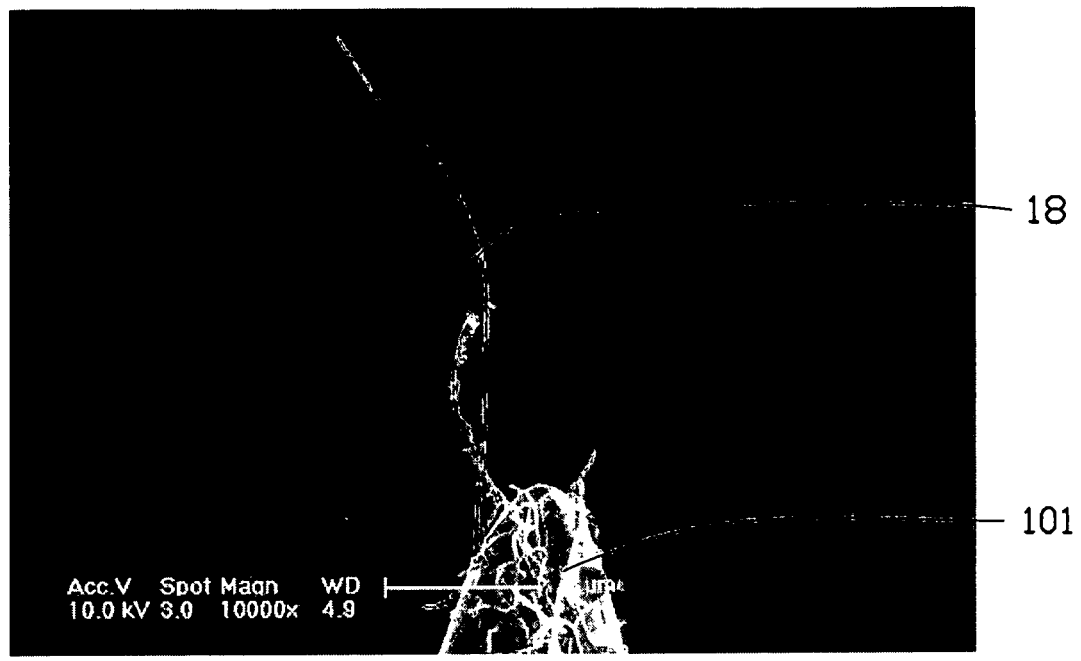
FIG. 3 is an image showing a single carbon nanotube connected with the tip of the electrical conductor, the image being taken using a scanning electron microscopy (SEM)

FIG. 3 is an image showing a single carbon nanotube 18 connected with the tip 101, the image being taken using scanning electron microscopy (SEM). Thereby, the apparatus having the one dimensional nano-material is obtained, and could be utilized in numerous electrical devices, for example, probes of atomic force microscopy (AFM).

Furthermore, if the one-dimensional nano-structure is to be interconnected between the tips of the electrical conductors, the method could further include a step of inspecting whether the one-dimensional nano-material is connected therebetween. For instance, in the illustrated embodiment, a resistor could be connected in series with the electrical conductors 10, 12. An oscillograph is connected in parallel with the resistor for showing an electrical current flowing through the resistor. If the carbon nanotube is interconnected between the tips of the electrical conductors, an electrical current will flow through the carbon nanotube 18. Therefore, the oscillograph will display a change in the electrical current. At this time, the alternating current voltage 16 is switched off. The liquid solvent of the solution 14 is then removed from the tips 101, 121. It should be understood that otherwise inspecting means could be utilized for the inspecting step, and it is not limited to the illustrated embodiment.

Therefore, the whole process of the method for manufacturing an apparatus having one-dimensional nano-structure could realize automatic operation and inspection. The producing efficiency associated therewith is manifestly improved. Furthermore, since the relative manufacturing machine is simple, the cost of the production is low. It is suitable for mass production of one-dimensional nano-structure-based device.

Figure 4:
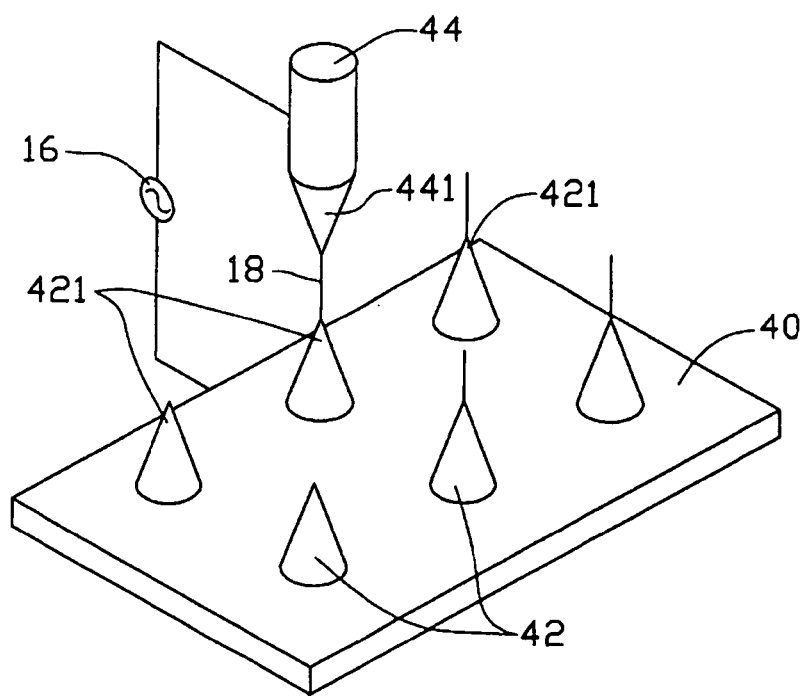
FIG. 4 is a schematic view showing a stage of a method for manufacturing a one-dimensional nano-structure-based device in accordance with another embodiment.

FIG. 4 shows a method for manufacturing the one-dimensional nano-structure-based device in accordance with another exemplary embodiment. In order to simplify the description of the present embodiment, the steps of the method will be described below in detail, also using carbon nanotube as an example of the those kinds of the one-dimensional nano-structures. In the illustrated embodiment, the method comprises the steps of:

Step (1'), preparing a solution 14 containing a plurality of carbon nanotubes 18;

Step (2'), providing a plurality of first electrical conductors 42, the first electrical conductors 42 each having a tip 421 to be treated;

Step (3'), providing a second electrical conductor 44 having a second tip 441, aligning the second electrical conductor with one of the first electrical conductors with the first and second tips of the first and second electrical conductor being spaced apart from and opposite to each other;

Step (4'), applying at least a drop of the solution to the first and second tips thereby the first and second tips being interconnected by the solution;

Step (5'), applying a voltage between the first and second tips thereby at least one one-dimensional nano-structures being interconnected between the first and second tips;

Step (6'), removing the liquid solvent of the solution;

Step (7'), disconnecting the first and second electrical conductor thereby obtaining the firstelectrical conductor having the first tip with the one-dimensional nano-structures connecting therewith; and Step (8), repeating the steps (3)-(7) thereby obtaining the plurality of first electrical conductors each having tips with the one-dimensional nano-structures connecting therewith.

Thereby, the tips 421 of the first electrical conductors 42 each have the carbon nanotubes 18 connected therewith.

In the illustrated embodiment, the second electrical conductors 42 are arranged on an electrical conductive plate 40. The voltage 16 is applied between the aligned first and second tips 421 of the first and second electrical conductors 42. Preferably, the second electrical conductors 42 are arranged orderly in an array and spaced from each other. The second electrical conductors 42 could be formed by many conventional techniques, for example, a semi-conductor fine treatment process.

Furthermore, the second electrical conductor 44 could be mounted to an automatically movable holder, such as a robot arm or the like. Thereby, the tip 441 could be readily moved to align with any one of the first tips 421 of the first electrical conductors. Alternatively, the second conductor 44 could be positioned, and the electrical plate 40 with the first electrical conductors 42 thereon is moved relative to the second conductor 44.

Moreover, if an electrical conductor 42 needs to be connected with a great amount of carbon nanotubes 18, the above mentioned method could be repeatedly performed thereby connecting more carbon nanotubes 18 to the second electrical conductors 42.

It is preferable that the exterior energy is applied to the portion of the carbon nanotube 18 near the tip 441 for separating the most of the carbon nanotube 18 from the tip 441.

Therefore, in the illustrated embodiment, the method for manufacturing the one-dimensional nano-structure-based device is very suitable for mass production of one-dimensional nano-structure-based devices.

Finally, while the present invention has been described with reference to particular embodiments, the description is illustrative of the invention and is not to be construed as limiting the invention. Therefore, various modifications can be made to the embodiments by those skilled in the art without departing from the true spirit and scope of the invention as defined by the appended claims.

What is claimed is:

1. A method for manufacturing one-dimensional nano-structure-based devices, the method comprising the steps of:
   (1) preparing a solution containing one-dimensional nano-structures and a liquid solvent;
   (2) providing a plurality of first electrical conductors, each of the electrical conductors having a first tip; and a second electrical conductor having a second tip;
   (3) aligning the second electrical conductor with one of the first electrical conductors so that the first tip of the first electrical conductor and the second tip of the second electrical conductor are spaced apart from and opposite to each other;
   (4) interconnecting the first tip of the first electrical conductor and the second tip of the second electrical conductor with the solution
   (5) supplying a voltage between the first tip of the first electrical conductor and the second tip of the second electrical conductor so that an electrical field is established between the first tip and the second tip, and the one-dimensional nano-structures in the solution are stretched by the electrical field and extend toward first tip and the second tip thereby at least one one-dimensional nano-structure is in contact with and located between the first tip and the second tip;
   (9) inspecting whether the one-dimensional nano-structure in the liquid solvent is interconnected between the first tip and the second tip, wherein step (9) comprises connecting a resistor in series with the electrical conductors, and connecting an oscillograph in parallel with the resistance for displaying an electric current flowing through the resistor to indicate whether the one-dimensional nano-structure is interconnected between the first tip and the second tip;
   (6) removing the liquid solvent of the solution;
   (7) applying an electric current to the at least one one-dimensional nano-structure to cut the at least one one-dimensional nano-structure, thereby obtaining the first electrical conductor having the first tip with the one-dimensional nano-structures connecting therewith; and
   (8) repeating the steps (3), (4), (5), (6) and (7) thereby obtaining the plurality of first electrical conductors each having tips with the one-dimensional nano-structures connecting therewith.

2. The method according to claim 1, wherein the applying the electric current to cut the at least one one-dimensional nano-structure comprises cutting the at least one one-dimensional nano-structure near the first tip of the second electrical conductor so as the most portion of the one-dimensional nano-structure is remained on the first tip.

3. The method according to claim 1, wherein the first tip of the first electrical conductor and the second tip of the second electrical conductor are spaced apart a distance which is slightly less than a length of the one-dimensional nano-structure.

4. The method according to claim 3, wherein a single one-dimensional nano-structure is interconnected between the first tip of the first electrical conductor and the second tip of the second electrical conductor.

5. The method according to claim 1, wherein the solution further contains ethyl cellulose used as a stabilizer.

6. The method according to claim 1, wherein the one-dimensional nano-structures are selected from the group consisting of nanotubes, nano-rods, and nano-threads.

* * * * *